(12) United States Patent
Byeon

(10) Patent No.: US 9,508,394 B2
(45) Date of Patent: Nov. 29, 2016

(54) INTEGRATED CIRCUIT SYSTEM AND MEMORY SYSTEM

(75) Inventor: Sang-Jin Byeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 830 days.

(21) Appl. No.: 13/333,863

(22) Filed: Dec. 21, 2011

(65) Prior Publication Data

US 2013/0107980 A1 May 2, 2013

(51) Int. Cl.
| | | |
|---|---|---|
| G06F 1/04 | (2006.01) | |
| G06F 12/00 | (2006.01) | |
| H04L 7/00 | (2006.01) | |
| G11C 5/02 | (2006.01) | |
| G11C 7/10 | (2006.01) | |
| G11C 7/22 | (2006.01) | |

(52) U.S. Cl.
CPC ............. *G11C 5/02* (2013.01); *G06F 12/00* (2013.01); *G11C 7/10* (2013.01); *G11C 7/222* (2013.01)

(58) Field of Classification Search
None
See application file for complete search history.

(56) References Cited

U.S. PATENT DOCUMENTS

| | | | | |
|---|---|---|---|---|
| 6,975,654 B1* | 12/2005 | Domon | ......................... | 370/509 |
| RE40,741 E * | 6/2009 | Simmonds et al. | .......... | 345/502 |
| 7,920,663 B1* | 4/2011 | Stevens | ......................... | 375/354 |
| 2002/0088003 A1* | 7/2002 | Salee | ............................ | 725/111 |
| 2005/0156647 A1 | 7/2005 | Kim | | |
| 2007/0214377 A1* | 9/2007 | Jarrar | ....................... | G06F 1/10 |
| | | | | 713/401 |
| 2009/0185211 A1* | 7/2009 | Sunayama | .................. | 358/1.13 |
| 2010/0020583 A1 | 1/2010 | Kang et al. | | |
| 2011/0141795 A1 | 6/2011 | Matsuzaki et al. | | |
| 2011/0161717 A1* | 6/2011 | Nojiri | ........................... | 713/502 |
| 2011/0225443 A1* | 9/2011 | Takahashi et al. | ........... | 713/503 |
| 2013/0107980 A1* | 5/2013 | Byeon | ........................... | 375/295 |

FOREIGN PATENT DOCUMENTS

| | | |
|---|---|---|
| CN | 1389917 | 1/2003 |
| TW | 200713328 | 4/2007 |
| TW | 201044791 | 12/2010 |

OTHER PUBLICATIONS

Office Action issued by the Taiwanese Intellectual Property Office on Oct. 21, 2015.

\* cited by examiner

*Primary Examiner* — Tanh Nguyen
(74) *Attorney, Agent, or Firm* — IP & T Group LLP

(57) ABSTRACT

An integrated circuit system comprising a first chip including a first period signal generation unit configured to generate a first period signal, transmit a first signal applied from a circuit outside of the integrated circuit system to a second chip, and transmit a second signal transmitted from the second chip to the circuit outside of the integrated circuit system, and the second chip including a second period signal generation unit configured to generate a second period signal, a code generation unit configured to generate codes corresponding to a difference between periods of the first period signal and the second period signal, and a delay unit configured to delay the second signal by using a delay value that is changed according to the codes.

7 Claims, 5 Drawing Sheets

INTEGRATED CIRCUIT SYSTEM AND MEMORY SYSTEM

CROSS-REFERENCE TO RELATED APPLICATIONS

The present application claims priority of Korean Patent Application No. 10-2011-0113622, filed on Nov. 2, 2011, which is incorporated herein by reference in its entirety.

BACKGROUND

1. Field

Exemplary embodiments of the present invention relate to an integrated circuit system.

2. Description of the Related Art

In the field of an integrated circuit system, a packaging technology for a semiconductor device may include features such as miniaturization and high capacity. Various techniques for stacked semiconductor packages may provide satisfactory results in terms of mounting efficiency as well as miniaturization and high capacity.

A stacked semiconductor package may be manufactured through a method of stacking individual semiconductor chips and simultaneously packaging the stacked semiconductor chips and a method of stacking individually packaged semiconductor packages. Semiconductor chips of a stacked semiconductor package are electrically connected through metal wires or through-silicon vias (TSVs).

In a conventional stacked semiconductor package using metal wires, since electrical signals are exchanged through metal wires, an operation speed decreases. Also, since a number of metal wires are used, the electrical characteristics of the stacked semiconductor package may be degraded. Further, in the conventional stacked semiconductor package, because additional area for forming the metal wires is required, the overall size of the stacked semiconductor package increases, and because gaps are required for wire-bonding of semiconductor chips, the overall height of the stacked semiconductor package increases.

In general, a stacked semiconductor package using through-silicon vias includes via holes defined to pass through semiconductor chips, through-silicon vias formed by filling a conductive substance in the via holes, and an upper semiconductor chip and a lower semiconductor chip electrically connected by the TSVs.

A stacked semiconductor package generally includes at least one master chip and a plurality of slave chips. The master chip is a chip that controls the plurality of slave chips and interfaces with a circuit outside of the stacked semiconductor package, and the slave chips are chips that operate under the direct control of the master chip or under the control of the signal transmitted through the master chip. Hereafter, operations of the stacked semiconductor package will be described by exemplifying a memory system.

In a memory system, a master chip generally is a chip that is placed at a lowermost position in the stacked semiconductor package, is applied with a command, an address, data signals, and so forth from a memory controller, and transmits them to slave chips. The master chip may also serve as an interface for transmitting the output data of the slave chips to the memory controller. A plurality of slave chips store or output data using the command and address that are transmitted through the master chip. In this example, the operation speeds of the plurality of slave chips may become different from one another according to processing or PVT (process, voltage and temperature) conditions.

Here, how the operation speeds of the plurality of slave chips become different from one another will be described by exemplifying a read operation. When a read command and an address are applied from the memory controller, the master chip transmits the read command and the address to the respective slave chips. Each slave chip combines the read command and the address and generates a signal for outputting data and a signal for determining a time when outputted data is transmitted to the master chip. The signal for determining a time when outputted data is transmitted to the master chip is generally referred to as a strobe signal. The strobe signal is generated through logic that is not synchronized with a clock in the slave chip. In this regard, the delay value of the logic for generating the strobe signal changes depending upon processing by which the slave chip is manufactured or PVT conditions. Thus, in the respective slave chips, times when strobe signals are activated become different from one another, and as a result, times when the output data of the respective slave chips are loaded on the through-silicon vias and are transmitted to the master chip become different from one another. More specifically, a skew occurs in terms of tAA (data access time) in the specification defined in a DRAM.

The master chip transmits the data transmitted from the plurality of slave chips to the memory controller using the clock generated therein or applied thereto. Accordingly, if the times when the data of the respective slave chips are transmitted to the master chip become different from one another, a margin decreases due to the occurrence of the skew.

SUMMARY

An embodiment of the present invention is directed to an integrated circuit system that includes a plurality of chips and is capable of reducing operation timing variations among the plurality of chips with different operation speeds.

In accordance with an embodiment of the present invention, an integrated circuit system comprising: a first chip including a first period signal generation unit configured to generate a first period signal, transmit a first signal applied from a circuit outside of the integrated circuit system to a second chip, and transmit a second signal transmitted from the second chip to the circuit outside of the integrated circuit system; and the second chip including a second period signal generation unit configured to generate a second period signal, a code generation unit configured to generate codes corresponding to a difference between periods of the first period signal and the second period signal, and a delay unit configured to delay the second signal by using a delay value that is changed according to the codes.

In accordance with another embodiment of the present invention, an integrated circuit system comprising: a first chip including a first period signal generation unit configured to generate a first period signal, transmit a first signal applied from a circuit outside of the integrated circuit system to a second chip, and transmit a second signal transmitted from the second chip to the circuit outside of the integrated circuit system; and the second chip including a second period signal generation unit configured to generate a second period signal, a code generation unit configured to generate codes corresponding to a difference between periods of the first period signal and the second period signal, and an output control unit configured to transmit the second signal to the first chip at a time that is determined according to the codes.

In accordance with another embodiment of the present invention, a memory system comprising: a master chip including a first period signal generation unit configured to generate a first period signal, transmit a command, an address, and data applied from a circuit outside of the memory system to a slave chip, and transmit output data transmitted from the slave chip to the circuit outside of the memory system; and the slave chip comprises a second period signal generation unit configured to generate a second period signal, a code generation unit configured to generate codes corresponding to a difference between periods of the first period signal and the second period signal, and a data output control unit configured to transmit the output data to the master chip at a time that is determined according to the codes.

In accordance with another embodiment of the present invention, an integrated circuit system comprising: a first chip including a first period signal generation unit configured to generate a first period signal, transmit a first signal applied from a circuit outside of the integrated circuit system to a second chip, and transmit a second signal transmitted from the second chip to the circuit outside of the integrated circuit system; and the second chip including a second period signal generation unit configured to generate a second period signal, a code generation unit configured to compare phases of the first period signal and the second period signal and generate codes, and a delay unit configured to delay the second signal by using a delay value that is changed according to the codes.

In accordance with yet another embodiment of the present invention, an integrated circuit system comprising: a first chip including a first period signal generation unit configured to generate a first period signal, transmit a first signal applied from a circuit outside of the integrated circuit system to a second chip, and transmit a second signal transmitted from the second chip to the circuit outside of the integrated circuit system; and the second chip including a second period signal generation unit configured to generate a second period signal, a code generation unit configured to compare phases of the first period signal and the second period signal and generate codes, and an output control unit configured to transmit the second signal to the first chip at a time that is determined according to the codes.

In accordance with still another embodiment of the present invention, a memory system comprising: a master chip including a first period signal generation unit configured to generate a first period signal, transmit a command, an address, and data applied from a circuit outside of the memory system to a slave chip, and transmit transmission data transmitted from the slave chip to the circuit outside of the memory system; and the slave chip including a second period signal generation unit configured to generate a second period signal, a code generation unit configured to compare phases of the first period signal and the second period signal and generate codes, and an output control unit configured to transmit the transmission data to the master chip at a time that is determined according to the codes.

DETAILED DESCRIPTION

Figure 1:
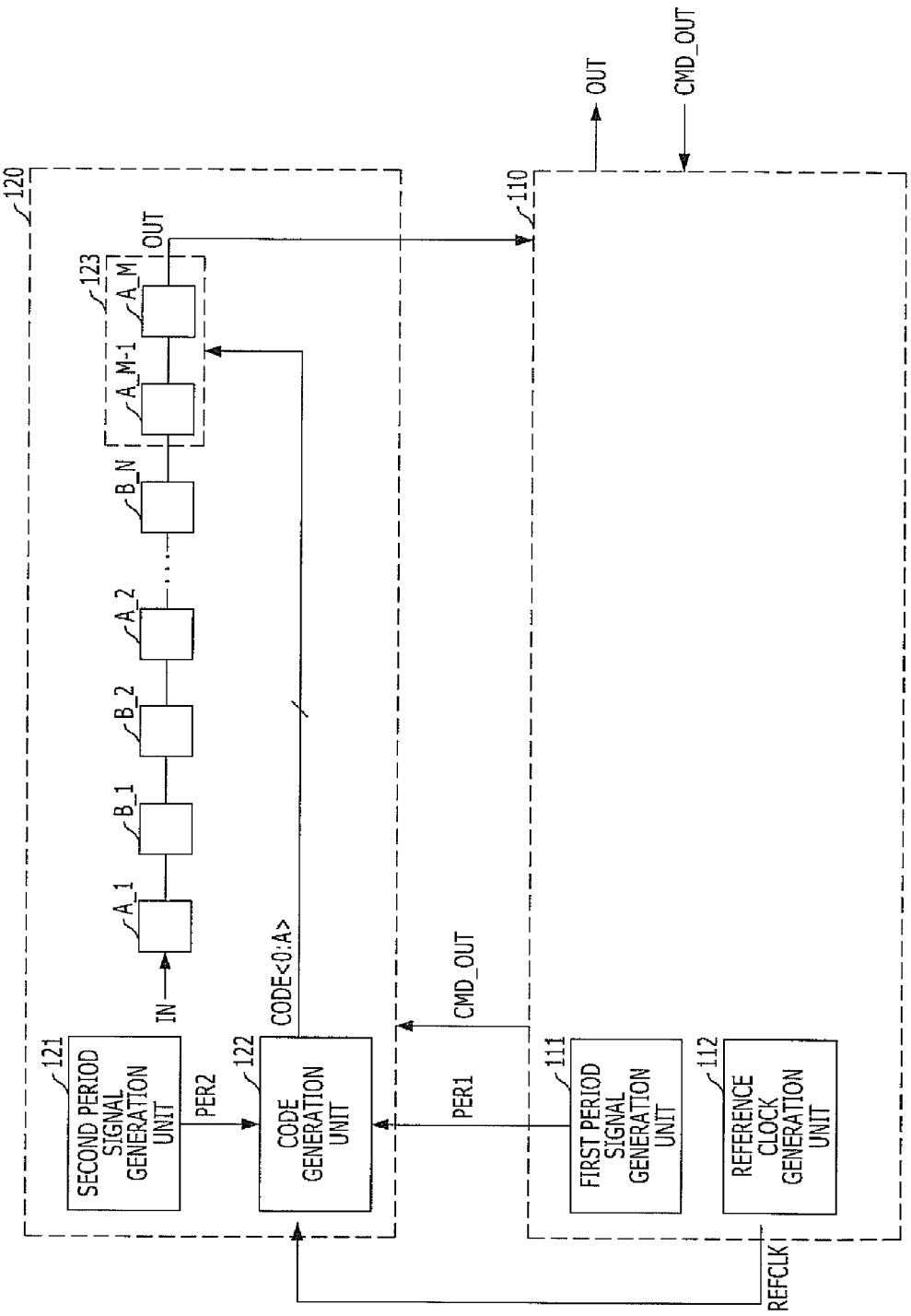
FIG. 1 is a configuration diagram of an integrated circuit system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following descriptions, while not shown in a drawing, signal transmission between chips is implemented through through-silicon vias (TSVs), which connect the chips with each other.

FIG. 1 is a configuration diagram of an integrated circuit system in accordance with an embodiment of the present invention.

Referring to FIG. 1, an integrated circuit system includes a first chip 110 and a second chip 120. The embodiment of the present invention may be applied to an integrated circuit system where the operation timings of a plurality of chips, which have different operation speeds according to processing or PVT conditions, should be synchronized with the operation timing of one chip specified among the plurality of chips.

The first chip 110 includes a first period signal generation unit 111 configured to generate a first period signal PER1. The first chip 110 transmits a signal applied from a circuit outside of the integrated circuit system to the second chip 120 and transmits a signal (hereinafter, referred to as an 'output signal OUT') transmitted from the second chip 120 to the circuit outside of the integrated circuit system.

The first period signal generation unit 111 generates the first period signal PER1, which has a period corresponding to the operation speed of the first chip 110 that changes depending upon PVT conditions. The fact that the period of the first period signal PER1 corresponds to the operation speed of the first chip 110 means that when the operation speed of the first chip 110 changes, the change is reflected and the period of the first period signal PER1 changes. If the operation speed of the first chip 110 becomes slow, the period of the first period signal PER1 is lengthened, and if the operation speed of the first chip 110 becomes fast, the period of the first period signal PER1 is shortened.

For example, if the first chip 110 is manufactured through a process by which the operation speed of a chip decreases, i.e., under PVT conditions by which the operation speed of the chip decreases, the period of the first period signal PER1 is lengthened because the delay values of the circuits included in the chip increase. Conversely, if the first chip 110 is manufactured through a process by which the operation speed of a chip increases, i.e., under PVT conditions by which the operation speed of the chip increases, the period of the first period signal PER1 is shortened because the delay values of the circuits included in the chip decrease.

Also, a degree that the operation speed of the first chip 110 changes, depending upon PVT conditions, is reflected in the first period signal PER1. More specifically, where the operation speed of the first chip 110 is greatly influenced by PVT conditions (more specifically, the operation speed of the first chip 110 greatly changes even when PVT conditions vary slightly), the period of the first period signal PER1 is greatly influenced by PVT conditions (more specifically, the period of the first period signal PER1 greatly changes even when PVT conditions vary slightly). Conversely, where the operation speed of the first chip 110 is less influenced by PVT conditions (more specifically, an amount of change in the operation speed of the first chip 110 according to variations in PVT conditions is small when compared to the above case), the period of the first period signal PER1 is less influenced by PVT conditions (more specifically, an amount of change in the period of the first period signal PER1 according to variations in PVT conditions is small when compared to the above case). Because the first period signal generation unit 111 is a circuit included in the first chip 110, the first period signal generation unit 111 is manufactured through the same process as the other circuits included in the first chip 110. The first period signal generation unit 111 may include an oscillator.

The second chip 120 includes a second period signal generation unit 121 configured to generate a second period signal PER2, a code generation unit 122 configured to generate codes CODE<0:A> corresponding to the difference between the periods of the first period signal PER1 and the second period signal PER2, and a delay unit 123 configured to delay the output signal OUT by a delay value that changes depending upon the codes CODE<0:A>.

The second period signal generation unit 121 generates the second period signal PER2, which has a period corresponding to the operation speed of the second chip 120 that changes depending upon PVT conditions. The relationship among the second chip 120, the second period signal generation unit 121, and the second period signal PER2 is the same as the relationship among the first chip 110, the first period signal generation unit 111, and the first period signal PER1. The second period signal generation unit 121 may include an oscillator.

To ensure that the difference between the operation speed of the first chip 110 and the operation speed of the second chip 120 reflected in the difference between the first period signal PER1 and the second period signal PER2, the first period signal generation unit 111 and the second period signal generation unit 121 may be configured by the same circuits. In this example, since the first period signal generation unit 111 and the second period signal generation unit 121 have the same circuit structure, the difference between their periods is induced, for example, only by the difference between their delay values.

The code generation unit 122 counts a reference clock REFCLK, which is generated by a reference clock generation unit 112 of the first chip 110, and generates the codes CODE<0:A> corresponding to the difference between the periods of the first period signal PER1 and the second period signal PER2. The codes CODE<0:A> may be generated by counting the reference clock REFCLK during an interval corresponding to the difference between the periods of the first period signal PER1 and the second period signal PER2, or the codes CODE<0:A> may be generated by using the difference between a value obtained by counting the reference clock REFCLK during an interval corresponding to the first period signal PER1 and a value obtained by counting the reference clock REFCLK during an interval corresponding to the second period signal PER2.

The delay unit 123 delays the output signal OUT using the delay value that changes according to the codes CODE<0:A>. More specifically, the delay value, or the amount a signal is delayed while passing through the delay unit 123, changes depending upon the codes CODE<0:A>. To this end, the delay unit 123 includes a plurality of unit delay sections (not shown in FIG. 1) that are activated or deactivated in response to the codes CODE<0:A>. The output signal OUT is delayed by unit delay sections, which are activated among the plurality of unit delay sections.

Here, the unit delay sections correspond to asynchronous delay sections that delay signals inputted thereto while not being synchronized with a clock signal. An integrated circuit generally includes both a synchronous delay circuit and an asynchronous delay circuit. The second chip 120 includes a plurality of asynchronous delay circuits A_1 to A_M and a plurality of synchronous delay circuits B_1 to B_N. Since the synchronous delay circuits B_1 to B_N operate in synchronization with a clock signal, all chips operate in synchronization with the same clock signal even when a difference is induced between the operation speeds of chips by processing and PVT conditions. However, in the asynchronous delay circuits A_1 to A_M, if a difference is induced between the operation speeds of chips by processing and PVT conditions, a timing variation occurs when receiving and transmitting signals between chips. Due to this fact, an operation margin decreases.

In detail, the above-described timing variation is caused by one or more asynchronous delay circuits A_M−1 and A_M (see FIG. 1) (hereinafter referred to as 'output end asynchronous delay circuits') positioned after the synchronous delay circuit B_N through which the signal OUT) passes. Even when a timing variation occurs before the final synchronous delay circuit B_N due to the difference between the operation speeds of chips, synchronization is effected by the same clock signal in the final synchronous delay circuit B_N.

Accordingly, some or all of the asynchronous delay circuits included in the output end asynchronous delay circuits A_M−1 and A_M are included in the delay unit 123, which has a delay value is determined according to the codes CODE<0:A> in the embodiment of the present invention. Each of the asynchronous delay circuits A_M−1 and A_M includes at least one unit delay section. The operations of the integrated circuit system shown in FIG. 1 will be described below based on the above-described configuration. If a command (hereinafter referred to as an 'output command CMD_OUT') for outputting the output signal OUT of the second chip 120 to a circuit outside of the integrated circuit system is applied to the first chip 110, the first chip 110 transmits the output command CMD_OUT to the second chip 120. A signal IN generated in the second chip 120 by the output command CMD_OUT is outputted as the output signal OUT after passing through the plurality of synchronous delay circuits B_1 to B_N and the plurality of asynchronous delay circuits A_1 to A_M, and the output signal OUT is transmitted to the first chip 110.

The first period signal generation unit 111 generates the first period signal PER1, which has the period corresponding to the operation speed of the first chip 110, and the second period signal generation unit 121 generates the second period signal PER2, which has the period corresponding to the operation speed of the second chip 120. The code generation unit 122 counts the reference clock REFCLK, which is generated in the reference clock generation unit 112, and generates the codes CODE<0:A> corresponding to the difference between the periods of the first period signal PER1 and the second period signal PER2. The delay value of the delay unit 123 is determined (more specifically, increases or decreases) in response to the codes CODE<0: A>.

As a result, a time when the second chip 120 transmits the output signal OUT to the first chip 110 is determined according to the difference between the periods of the first period signal PER1 and the second period signal PER2. As described above, the difference between the periods of the first period signal PER1 and the second period signal PER2 corresponds to the difference between the operation speeds of the first chip 110 and the second chip 120. As a consequence, the time when the second chip 120 transmits the output signal OUT to the first chip 110 is determined according to the difference between the operation speeds of the first chip 110 and the second chip 120.

For example, the period of the first period signal PER1 is assumed to become shorter than the period of the second period signal PER2 when the operation speed of the first chip 110 is faster than the operation speed of the second chip 120. In this example, the delay value of the delay unit 123 decreases to advance the time when the output signal OUT is transmitted to the first chip 110 in response to the codes CODE<0:A>.

Conversely, the period of the first period signal PER1 is assumed to become longer than the period of the second period signal PER2 when the operation speed of the first chip 110 is slower than the operation speed of the second chip 120. In this example, the delay value of the delay unit 123 increases to defer the time when the output signal OUT is transmitted to the first chip 110 in response to the codes CODE<0:A>.

Additionally, the first chip 110 and the second chip 120 may be configured in the same manner. For example, when the first chip 110 and the second chip 120 are stacked, the first chip 110 and the second chip 120 are chips for performing specified functions. In this design, only component elements necessary to perform the specified functions are activated among the component elements of the first and second chips 110 and 120 so that the first and second chips 110 and 120 can perform the specified functions.

In detail, each of the first chip 110 and the second chip 120 may include the first period signal generation unit 111, the second period signal generation unit 121, the code generation unit 122, and the delay unit 123. In the embodiment where the first chip 110 is a chip for performing functions of transmitting the signal CMD_OUT applied from the circuit outside of the integrated circuit system to the second chip 120 and transmitting the output signal OUT of the second chip 120 to the circuit outside of the integrated circuit system, the first period signal generation unit 111 may be activated among the component elements of the first chip 110. In the embodiment where the second chip 120 is a chip for performing a function of transmitting its output signal to the first chip 110, the second period signal generation unit 121, the code generation unit 122, and the delay unit 123 may be activated among the component elements of the second chip 120 such that the second chip 120 can transmit the signal OUT delayed according to the codes CODE<0:A> to the first chip 110.

The operation timings of remaining chips (hereafter referred to as 'slave chips') may be matched to the operation timing of a chip communicating with the circuit outside of the integrated circuit system among a plurality of chips, regardless of variations in processing and PVT conditions, in the integrated circuit system according to the embodiment of the present invention. By controlling times when signals are transmitted from the slave chips to the master chip, a sufficient margin may be secured in the communication between the integrated circuit system and the circuit outside of the integrated circuit system. In the above description, the master chip corresponds to the first chip 110, and the remaining slave chips correspond to the second chip 120.

Figure 2:
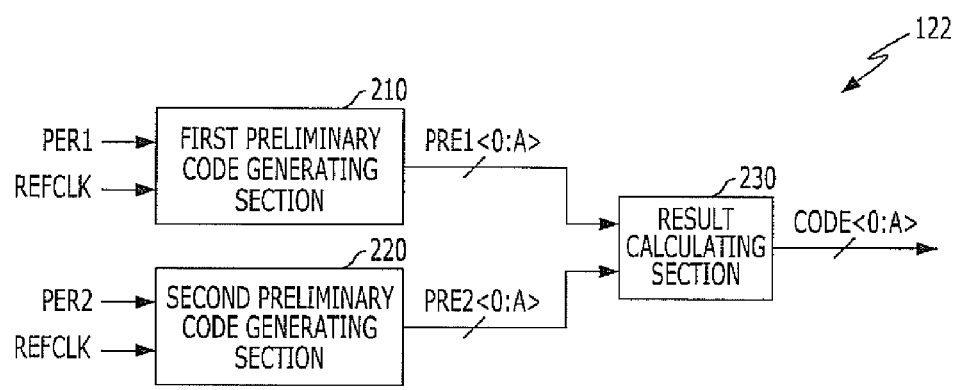
FIG. 2 is a configuration diagram of the code generation unit included in the second chip of the integrated circuit system shown in FIG. 1.

FIG. 2 is a configuration diagram of the code generation unit 122 included in the second chip 120 of the integrated circuit system shown in FIG. 1.

The code generation unit 122 shown in FIG. 2 generates the codes CODE<0:A> by using a difference between a value obtained by counting the reference clock REFCLK during an interval corresponding to the first period signal PER1 and a value obtained by counting the reference clock REFCLK during an interval corresponding to the second period signal PER2.

Referring to FIG. 2, the code generation unit 122 includes a first preliminary code generating section 210 configured to count the reference clock REFCLK and generate first preliminary codes PRE1<0:A> corresponding to the period of the first period signal PER1, a second preliminary code generating section 220 configured to count the reference clock REFCLK and generate second preliminary codes PRE2<0:A> corresponding to the period of the second period signal PER2, and a result calculating section 230 configured to generate the codes CODE<0:A> by using the difference between the first preliminary codes PRE1<0:A> and the second preliminary codes PRE2<0:A>.

Hereafter, operations of the code generation unit 122 will be described with reference to FIG. 2.

The first preliminary code generating section 210 counts the reference clock REFCLK during the interval corresponding to the period of the first period signal PER1 and generates the first preliminary codes PRE1<0:A>. Therefore, the code value of the first preliminary codes PRE1<0: A> corresponds to the period of the first period signal PER1. The first preliminary code generating section 210 may include a latch stage (not shown in FIG. 2) for storing the first preliminary codes PRE1<0:A>.

The second preliminary code generating section 220 counts the reference clock REFCLK during the interval corresponding to the period of the second period signal PER2 and generates the second preliminary codes PRE2<0: A>. Therefore, the code value of the second preliminary codes PRE2<0:A> corresponds to the period of the second period signal PER2. The second preliminary code generating section 220 may include a latch stage (not shown in FIG. 2) for storing the second preliminary codes PRE2<0:A>.

Here, the code values of the preliminary codes PRE1<0: A> and PRE2<0:A> are determined according to the lengths of the periods of the period signals PER1 and PER2. The preliminary codes PRE1<0:A> and PRE2<0:A> are values obtained by counting the reference clock REFCLK during intervals corresponding to a constant K (K is a natural number) times the periods of the period signals PER1 and PER2. In the example where K is greater than 1, the preliminary code generating sections 210 and 220 may include frequency dividers (not shown in FIG. 2) for increasing the periods of the period signals PER1 and PER2.

In the embodiment where the preliminary codes PRE1<0: A> and PRE2<0:A> are generated by increasing the periods of the period signals PER1 and PER2 and counting the reference clock REFCLK during the increased intervals, since the difference between the first period signal PER1 and the second period signal PER2 also increases, the precision of the code generation unit may be improved without decreasing the period of the reference clock REFCLK.

The result calculating section 230 generates the codes CODE<0:A> by using the difference between the first preliminary codes PRE1<0:A> and the second preliminary codes PRE2<0:A>. A constant L times the difference between the first preliminary codes PRE1<0:A> and the second preliminary codes PRE2<0:A> becomes the codes CODE<0:A>, and the result calculating section 230 may include a circuit for performing subtraction of binary codes. When L is not 1, the result calculating section 230 may include a calculation circuit for multiplying L by the difference between the first preliminary codes PRE1<0:A> and the second preliminary codes PRE2<0:A>.

Here, L is determined by calculating how the delay value of the delay unit 123 changes depending upon a change in the value of the codes CODE<0:A>. As a change in the delay value of the delay unit 123 depending upon a change in the value of the codes CODE<0:A> increases, the value of L is set to be small.

While an exemplary embodiment of the code generation unit 122 is illustrated in FIG. 2, the configuration of the code generation unit 122 is not limited the structure shown in FIG. 2. For example, the code generation unit 122 may be constituted by a pulse signal generation stage configured to generate a pulse signal that is activated during an interval corresponding to the difference between the periods of the first period signal PER1 and the second period signal PER2 and a code generation stage configured to generate the codes CODE<0:A> by counting the reference clock REFCLK during the interval when the pulse signal is activated.

Figure 3:
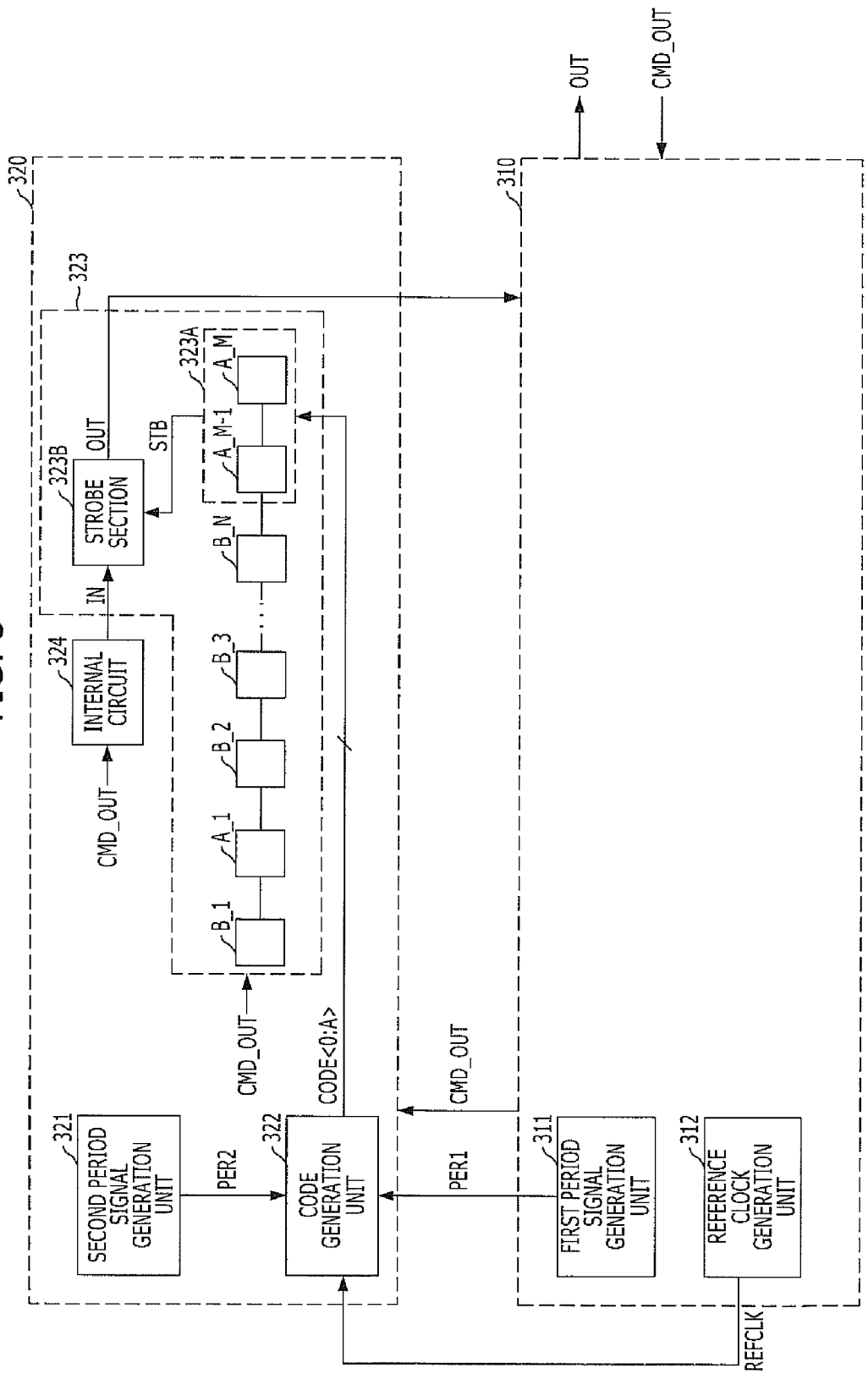
FIG. 3 is a configuration diagram of an integrated circuit system in accordance with another embodiment of the present invention.

FIG. 3 is a configuration diagram of an integrated circuit system in accordance with another embodiment of the present invention.

Referring to FIG. 3, the integrated circuit system includes a first chip 310 and a second chip 320. While the integrated circuit system shown in FIG. 1 directly controls the delay value of the signal to be transmitted from the second chip 120 to the first chip 110, the integrated circuit system shown in FIG. 3 controls the delay value of a signal for determining the output time of a signal to be transmitted from the second chip 320 to the first chip 310.

The first chip 310 includes a first period signal generation unit 311 configured to generate a first period signal PER1. The first chip 310 transmits a signal applied from a circuit outside of the integrated circuit system to the second chip 320, and the first chip 310 transmits the output signal of the second chip 320 to the circuit outside of the integrated circuit system.

The first period signal generation unit 311 generates the first period signal PER1, which has a period corresponding to the operation speed of the first chip 310 that changes depending upon PVT conditions. The period of the first period signal PER1 corresponds to the operation speed of the first chip 310 for the same described above with reference to FIG. 1. The first period signal generation unit 311 may include an oscillator.

The second chip 320 includes a second period signal generation unit 321 configured to generate a second period signal PER2, a code generation unit 322 configured to generate codes CODE<0:A> corresponding to the difference between the periods of the first period signal PER1 and the second period signal PER2, and an output control unit 323 configured to transmit an output signal OUT of the second chip 320 to the first chip 310 at a time that is determined according to the codes CODE<0:A>. An internal circuit 324 represents a circuit that performs an operation of an integrated circuit (for example, corresponding to a core including memory cells in the case of a memory). The internal circuit 324 generates a signal IN to be transmitted as the output signal OUT.

The second period signal generation unit 321 generates the second period signal PER2, which has a period corresponding to the operation speed of the second chip 320 that changes depending upon PVT conditions. The relationship among the second chip 320, the second period signal generation unit 321, and the second period signal PER2 is the same as the relationship among the first chip 310, the first period signal generation unit 311, and the first period signal PER1 of FIG. 1. The second period signal generation unit 321 may include an oscillator.

To ensure that the difference between the operation speeds of the first chip 310 and the second chip 320 is reflected through the difference between the first period signal PER1 and the second period signal PER2, the first period signal generation unit 311 and the second period signal generation unit 321 may be configured by the same circuits.

The code generation unit 322 counts a reference clock REFCLK, which is generated by a reference clock generation unit 312 of the first chip 310, and generates the codes CODE<0:A> corresponding to the difference between the periods of the first period signal PER1 and the second period signal PER2. The codes CODE<0:A> may be generated using the same methods described above with reference to FIGS. 1 and 2.

The output control unit 323 transmits the output signal OUT of the second chip 320 to the first chip 310 at a time that changes according to the codes CODE<0:A>. For this operation, the output control unit 323 includes a strobe section 323B configured to transmit the output signal OUT of the second chip 320 to the first chip 310 at a time when a strobe signal STB is activated, and a delay line 323A configured to control the delay value of the strobe signal STB according to the codes CODE<0:A>. The delay line 323A includes a plurality of unit delay sections (not shown in FIG. 3) that are activated or deactivated in response to the codes CODE<0:A>. The delay value of the strobe signal STB is determined by unit delay sections, which are activated among the plurality of unit delay sections. The unit delay sections correspond to the asynchronous delay sections, which are described above with reference to FIG. 1.

The strobe signal STB is generated by using an output command CMD_OUT, which is applied from the circuit outside of the integrated circuit system to output the output signal OUT of the second chip 320. As the output command CMD_OUT passes through the synchronous delay circuits and the asynchronous delay circuits described above with reference to FIG. 1, the strobe signal STB is generated. The operation speeds of the first chip 310 and the second chip 320 may become different from each other by one or more asynchronous delay circuits A_M−1 and A_M (see FIG. 3) (hereinafter referred to as 'output end asynchronous delay circuits') positioned after a synchronous delay circuit B_N through which the output command CMD_OUT finally passes, as similarly described above with reference to FIG. 1. Accordingly, some or all of the one or more asynchronous delay circuits included in the output end asynchronous delay circuits A_M−1 and A_M are included in the delay line 323A, and the delay value is determined according to the codes CODE<0:A> in the embodiment of the present invention.

The entire operation of the integrated circuit system shown in FIG. 3 will be described below based on the above-described configuration. If the output command CMD_OUT for outputting the output signal OUT of the second chip 320 to the circuit outside of the integrated circuit system is applied to the first chip 310 from the circuit outside of the integrated circuit system, the first chip 310 transmits the output command CMD_OUT to the second chip 320. The first period signal generation unit 311 generates the first period signal PER1, which has the period corresponding to the operation speed of the first chip 310, and the second period signal generation unit 321 generates the second period signal PER2, which has the period corresponding to the operation speed of the second chip 320. The code generation unit 322 counts the reference clock REFCLK, which is generated in the reference clock generation unit 312 of the first chip 310, and the code generation unit 322 generates the codes CODE<0:A> corresponding to the difference between the periods of the first period signal PER1 and the second period signal PER2. The output command CMD_OUT is transmitted as the strobe signal STB after passing through the plurality of synchronous delay circuits B_1 to B_N and the plurality of asynchronous delay circuits A_1 to A_M. The plurality of delay circuits A_1 to A_M and B_1 to B_N may correspond to component elements that process the output command CMD_OUT and generate the strobe signal STB.

Since the delay value of the delay line 323A is determined by the codes CODE<0:A>, the time when the strobe signal STB is activated is determined in response to the codes CODE<0:A>. The signal IN outputted from the internal circuit 324 in response to the output command CMD_OUT is stored in the strobe section 323B and is transmitted as the output signal OUT when the strobe signal STB is activated. The strobe section 323B transmits the output signal OUT from the second chip 320 to the first chip 310 when the strobe signal STB is activated. Namely, the time when the output signal OUT is transmitted from the second chip 320 to the first chip 310 is determined according to the difference between the periods of the first period signal PER1 and the second period signal PER2.

Since the difference between the periods of the first period signal PER1 and the second period signal PER2 corresponds to the difference between the operation speeds of the first chip 310 and the second chip 320, the time when the output signal OUT is transmitted from the second chip 320 to the first chip 310 is determined according to the difference between the operation speeds of the first chip 310 and the second chip 320. The delay value of the delay line 323A may increase or decrease according to the value of the codes CODE<0:A>.

The integrated circuit system shown in FIG. 1 and the integrated circuit system shown in FIG. 3 are different because the delay value of the output signal OUT of the second chip 120 in the integrated circuit system of FIG. 1 is directly controlled in response to the codes CODE<0:A>, and the delay value of the strobe signal STB for determining the time when the output signal OUT is transmitted from the second chip 320 to the first chip 310 in the integrated circuit system of FIG. 3 is controlled in response to the codes CODE<0:A>. The integrated circuit systems shown in FIGS. 1 and 3 are, however, the same in terms of the time when the output signal OUT of the second chip 310 is transmitted to the first chip 310 is substantially determined according to the difference between the operation speeds of the first chip 310 and the second chip 320, and the effects of the integrated circuit system shown in FIG. 3 are the same as those of the integrated circuit system shown in FIG. 1.

Further, the first chip 310 and the second chip 320 may be configured in the same manner. For example, when the first chip 310 and the second chip 320 are stacked, the first chip 310 and the second chip 320 are chips for performing specified functions and only component elements necessary to perform the specified functions are activated among the component elements of the first and second chips 310 and 320. In detail, each of the first chip 310 and the second chip 320 may include the first period signal generation unit 311, the second period signal generation unit 321, the code generation unit 322, and the output control unit 323. In the example where the first chip 310 is a chip for performing functions of transmitting the signal CMD_OUT applied from the circuit outside of the integrated circuit system to the second chip 320 and transmitting the output signal OUT of the second chip 320 to the circuit outside of the integrated circuit system, the first period signal generation unit 311 may be activated among the component elements of the first chip 310. In the example where the second chip 320 is a chip for performing a function of transmitting its output signal to the first chip 310, the second period signal generation unit 321, the code generation unit 322, and the output control unit 323 may be activated among the component elements of the second chip 320 so that the second chip 320 can transmit its output signal OUT to the first chip 310 at the time determined according to the codes CODE<0:A>.

Hereafter, operations of a memory system in accordance with another embodiment of the present invention will be described with reference again to FIG. 3. In the example where the integrated circuit system according to the embodiment of the present invention is a semiconductor memory system, the first chip 310 corresponds to a master chip, and the second chip 320 corresponds to a slave chip. The internal configuration and operation of the master chip are the same as those of the first chip 310, and the internal configuration and operation of the slave chip are the same as those of the second chip 320. A signal applied from the circuit outside of the integrated circuit system to the first chip 310 may include a command, an address, data, and the like, and an output signal OUT of the second chip 320 may include data, etc.

The master chip 310 includes a first period signal generation unit (corresponding to the first period signal generation unit 311 of the integrated circuit system) configured to generate a first period signal PER1. The master chip 310 transmits a signal (a command, an address, data, and the like) applied from a circuit outside of the memory system to the slave chip 320, and the master chip 310 transmits the data signal (corresponding to the output signal OUT of the integrated circuit system) outputted from the slave chip 320 to the circuit outside of the memory system.

The function of the first period signal generation unit 311 is the same as those described above with reference to the integrated circuit system shown in FIG. 3.

The slave chip 320 includes a second period signal generation unit 321 configured to generate a second period signal PER2, a code generation unit 322 configured to generate codes CODE<0:A> corresponding to the difference between the periods of the first period signal PER1 and the second period signal PER2, and a data output control unit (corresponding to the output control unit 323 in the integrated circuit system) configured to transmit the output data signal OUT of the slave chip 320 to the master chip 310 at a time that is determined according to the codes CODE<0:A>.

The function of the second period signal generation unit 321 is the same as those described above with reference to the integrated circuit system shown in FIG. 3.

To ensure that the difference between the operation speeds of the master chip 310 and the slave chip 320 according to processing and PVT conditions is reflected through the difference between the first period signal PER1 and the second period signal PER2, the first period signal generation unit 311 and the second period signal generation unit 321 may be configured by the same circuits.

The code generation unit 322 generates the CODE<0:A> using a value obtained by counting the interval corresponding to the difference between the periods of the first period signal PER1 and the second period signal PER2 in response to the reference clock REFCLK, which is generated in a reference clock generation unit of the master chip 310 (corresponding to the reference clock generation unit 312 of the integrated circuit system). The codes CODE<0:A> may be generated using the methods described above with reference to FIG. 1.

The data output control unit 323 transmits the output data signal OUT of the slave chip 320 to the master chip 310 at a time that changes according to the codes CODE<0:A>. For this operation, the data output control unit 323 includes a strobe section 323B configured to transmit the output data signal OUT of the slave chip 320 to the master chip 310 at a time when a strobe signal STB is activated, and data output control unit 323 also includes a delay line 323A configured to control the delay value of the strobe signal STB according to the codes CODE<0:A>. The delay line 323A includes a plurality of unit delay sections (not shown in FIG. 3) that are activated or deactivated in response to the codes CODE<0:A>. The delay value of the strobe signal STB is determined by unit delay sections that are activated among the plurality of unit delay sections. The unit delay sections correspond to the asynchronous delay sections, which are described above with reference to FIG. 1.

The strobe signal STB may be generated by using a data read command CMD_OUT, which is applied from the circuit outside of the memory system to output the output data signal OUT of the slave chip 320. The data read command CMD_OUT passes through all of the synchronous delay circuits and the asynchronous delay circuits described above with reference to FIG. 1. The operation speeds of the master chip 310 and the slave chip 320 may become different from each other by the output end asynchronous delay circuits A_M−1 and A_M through which the data read command CMD_OUT passes, as similarly described above with reference to FIG. 1. Accordingly, some or all of the one or more asynchronous delay circuits included in the output end asynchronous delay circuits A_M−1 and A_M are included in the delay line 323A, and the delay value is determined according to the codes CODE<0:A> in the memory system according to the embodiment of the present invention.

Further, transmission of a command, an address, data, etc. between the master chip 310 and the slave chip 320 may be implemented through through-silicon vias (TSVs), which are formed through the master chip 310 and the slave chip 320.

The entire operations of the memory system shown in FIG. 3 will be described below based on the above-described configuration. If the data read command CMD_OUT for outputting the data signal OUT outputted from the slave chip 320 to the circuit outside of the memory system is applied to the master chip 310, the master chip 310 transmits the data read command CMD_OUT to the slave chip 320. The first period signal generation unit 311 generates the first period signal PER1, which has the period corresponding to the operation speed of the master chip 310, and the second period signal generation unit 321 generates the second period signal PER2, which has the period corresponding to the operation speed of the slave chip 320. The code generation unit 322 counts the reference clock REFCLK, which is generated in the reference clock generation unit 312 of the master chip 310, and generates the codes CODE<0:A> corresponding to the difference between the periods of the first period signal PER1 and the second period signal PER2. The data read command CMD_OUT is transmitted as the data strobe signal STB after passing through a plurality of synchronous delay circuits B_1 to B_N and the plurality of asynchronous delay circuits A_1 to A_M. More specifically, the plurality of delay circuits A_1 to A_M and B_1 to B_N process the data read command CMD_OUT and generate the data strobe signal STB.

Since the delay value of the delay line 323A is determined by the codes CODE<0:A>, the time when the data strobe signal STB is activated is determined in response to the codes CODE<0:A>. Data IN outputted from a memory core region (corresponding to the internal circuit 324 of the integrated circuit system) in response to the data read command CMD_OUT is stored in the strobe section 323B and is transmitted as the output data signal OUT when the data strobe signal STB is activated. The strobe section 323B transmits the output data signal OUT from the slave chip 320 to the master chip 310 when the strobe signal STB is activated, and the master chip 310 outputs the output data signal OUT to the circuit outside of the semiconductor memory system.

Figure 4:
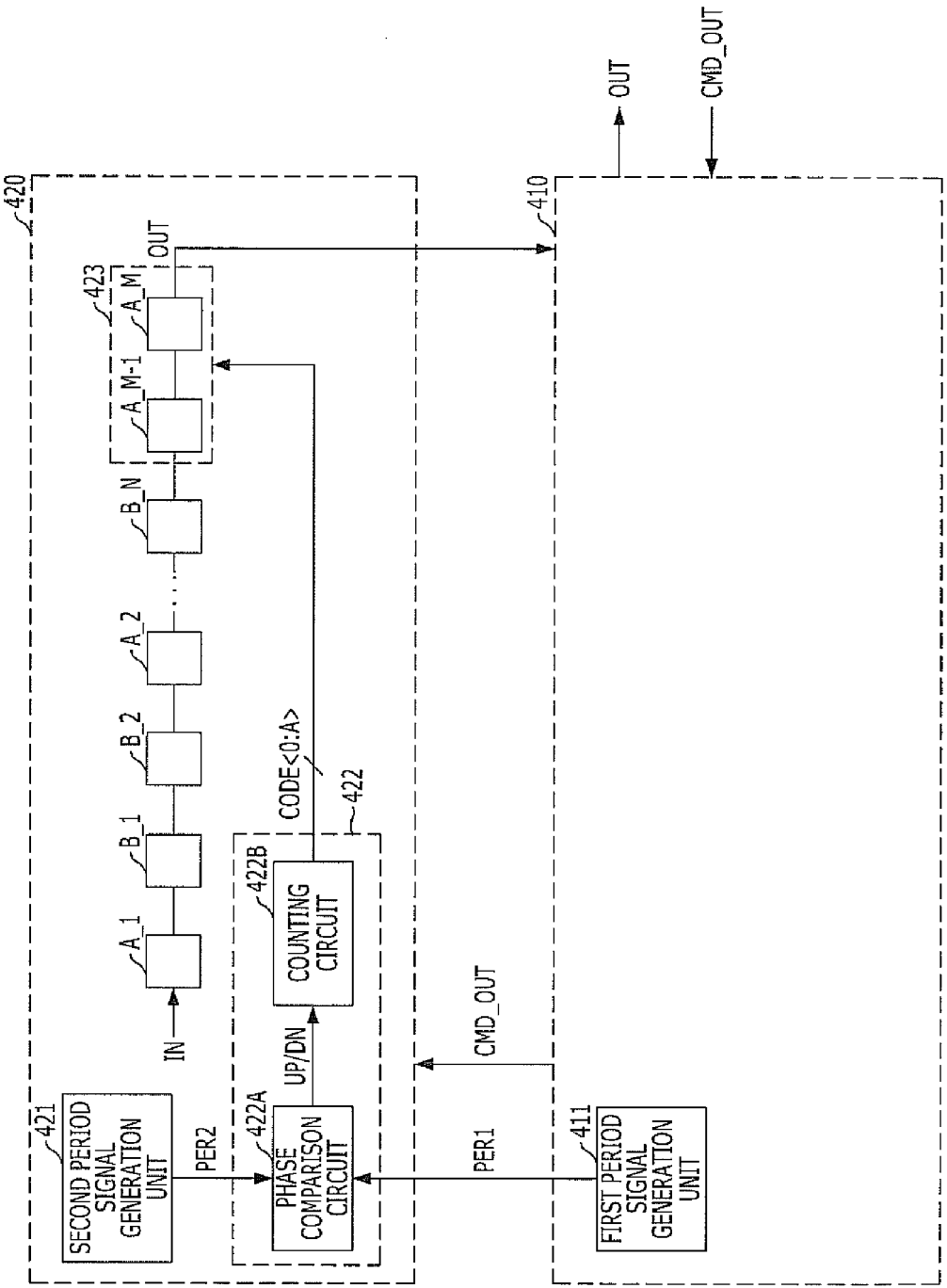
FIG. 4 is a configuration diagram of an integrated circuit system in accordance with another embodiment of the present invention.

FIG. 4 is a configuration diagram of an integrated circuit system in accordance with another embodiment of the present invention.

Referring to FIG. 4, the integrated circuit system includes a first chip 410 and a second chip 420.

The integrated circuit system shown in FIG. 4 is substantially the same as the integrated circuit system shown in FIG. 1, except for a method that controls the delay value of an output signal OUT. Thus, the integrated circuit system shown in FIG. 4 will be described with respect to this method.

The first chip 410 includes a first period signal generation unit 411 configured to generate a first period signal PER1. The first chip 410 transmits a signal applied from a circuit outside of the integrated circuit system to the second chip 420, and the first chip 410 transmits a signal transmitted from the second chip 420 (corresponding to an output signal OUT of the second chip 420) to the circuit outside of the integrated circuit system.

The second chip 420 includes a second period signal generation unit 421 configured to generate a second period signal PER2, a code generation unit 422 configured to compare the phases of the first period signal PER1 and the second period signal PER2 and generate codes CODE<0:A>, and a delay unit 423 configured to delay the signal OUT by a delay value that changes depending upon the codes CODE<0:A>.

The code generation unit 422 generates and outputs the codes CODE<0:A> according to whether the phase of the first period signal PER1 is earlier or later than the phase of the second period signal PER2. For this operation, the code generation unit 422 may include a phase comparison circuit 422A configured to compare the phases of the first period signal PER1 and the second period signal PER2 and generate an up/down signal UP/DN, and the code generation unit 422 may also include a counting circuit 422B configured to generate the codes CODE<0:A> in response to the up/down signal UP/DN.

The phase comparison circuit 422A compares the phases of the first period signal PER1 and the second period signal PER2, and the phase comparison circuit 422A outputs the down signal DN when the phase of the first period signal PER1 is earlier than the phase of the second period signal PER2 (more specifically, the period of the first period signal PER1 is shorter than the period of the second period signal PER2) and outputs the up signal UP when the phase of the first period signal PER1 is later than the phase of the second period signal PER2 (more specifically, the period of the first period signal PER1 is longer than the period of the second period signal PER2).

The counting circuit 422B outputs the initial value of the codes CODE<0:A> when it is initialized. Thereafter, if the up signal UP is outputted by the phase comparison circuit 422A, the counting circuit 422B increases the value of the codes CODE<0:A>, and if the down signal DN is outputted, the counting circuit 422B decreases the value of the codes CODE<0:A>. If the value of the codes CODE<0:A> increases, the delay value of the delay unit 423 increases, and if the value of the codes CODE<0:A> decreases, the delay value of the delay unit 423 decreases.

A plurality of delay circuits A_1 to A_M and B_1 to B_N and a procedure that transmits the output signal OUT to the first chip 410 by the delay value changed according to the codes CODE<0:A> are the same as described above with reference to FIG. 1.

Since the phases of the first period signal PER1 and the second period signal PER2 are compared and the codes CODE<0:A> are generated in correspondence to the difference between the phases of the first period signal PER1 and the second period signal PER2, the reference clock REF-CLK is not generated as in the integrated circuit systems shown in FIGS. 1 and 3.

Further, the first chip 410 and the second chip 420 may be configured in the same manner. For example, when the first chip 410 and the second chip 420 are stacked, the first chip 410 and the second chip 420 are determined as chips for performing specified functions and, for example, only component elements necessary to perform the specified functions are activated among the component elements of the first and second chips 410 and 420. In detail, each of the first chip 410 and the second chip 420 may include the first period signal generation unit 411, the second period signal generation unit 421, the code generation unit 422, and the delay unit 423. In an example where the first chip 410 is a chip that transmits a signal CMD_OUT applied from the circuit outside of the integrated circuit system to the second chip 420 and transmits the output signal OUT of the second chip 420 to the circuit outside of the integrated circuit system, the first period signal generation unit 411 may be activated among the component elements of the first chip 410. In an example where the second chip 420 is a chip for performing a function of transmitting an output signal to the first chip 410, the second period signal generation unit 421, the code generation unit 422, and the delay unit 423 may be activated among the component elements of the second chip 420 such that the second chip 420 can transmit the signal OUT delayed according to the codes CODE<0:A> to the first chip 410.

Figure 5:
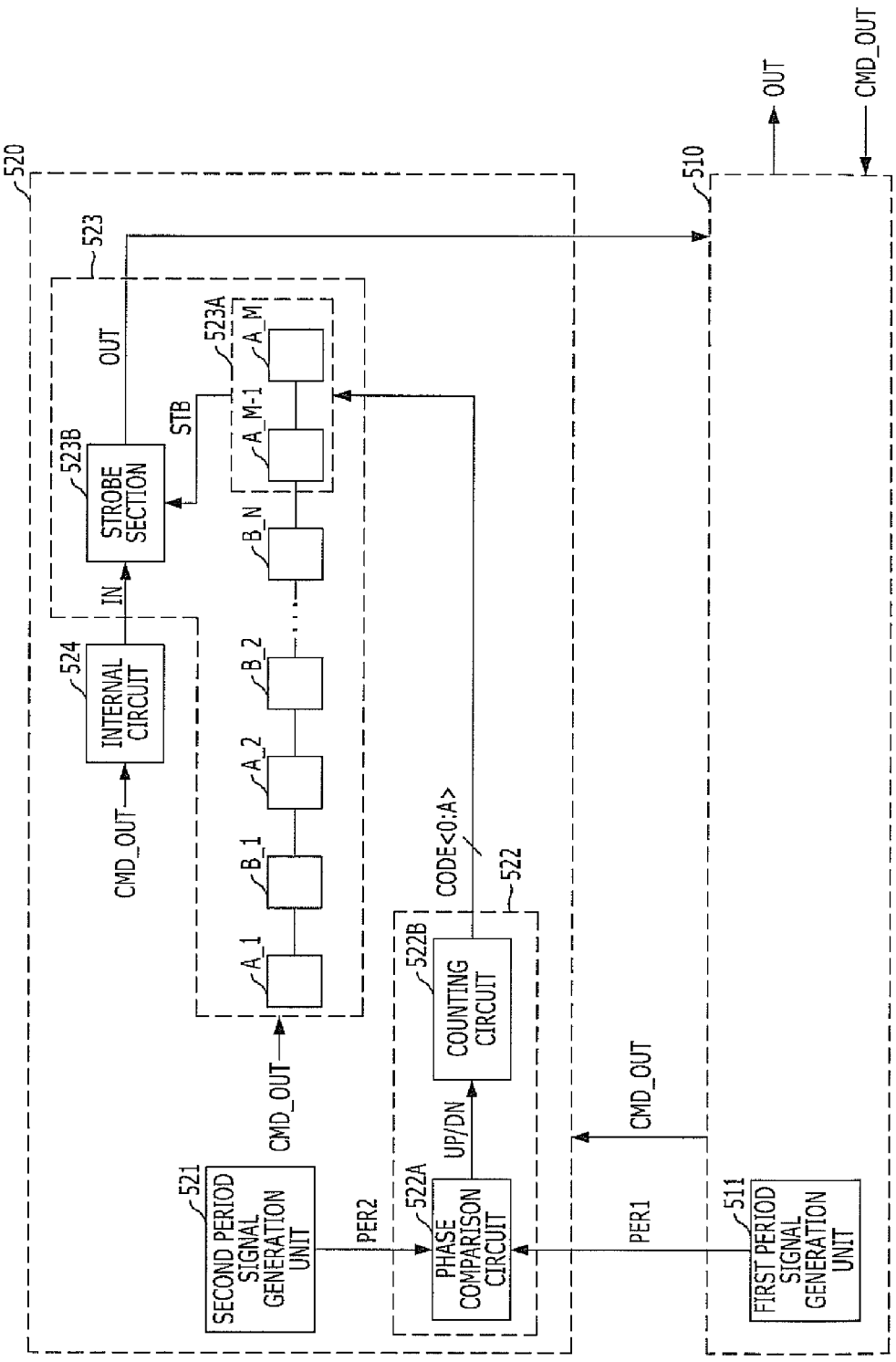
FIG. 5 is a configuration diagram of an integrated circuit system in accordance with another embodiment of the present invention.

FIG. 5 is a configuration diagram of an integrated circuit system in accordance with another embodiment of the present invention.

Referring to FIG. 5, the integrated circuit system includes a first chip 510 and a second chip 520.

The integrated circuit system shown in FIG. 5 is substantially the same as the integrated circuit system shown in FIG. 3, except for a method that controls the delay value of a strobe signal STB. Thus, the integrated circuit system shown in FIG. 5 will be described with respect to this method.

The first chip 510 includes a first period signal generation unit 511 configured to generate a first period signal PER1. The first chip 510 transmits a signal applied from a circuit outside of the integrated circuit system to the second chip 520, and the first chip 510 transmits a signal transmitted from the second chip 520 (corresponding to an output signal OUT of the second chip 520) to the circuit outside of the integrated circuit system.

The second chip 520 includes a second period signal generation unit 521 configured to generate a second period signal PER2, a code generation unit 522 configured to compare the phases of the first period signal PER1 and the second period signal PER2 and generate codes CODE<0:A>, and an output control unit 523 configured to transmit the output signal OUT of the second chip 520 to the first chip 510 at a time that is determined according to the codes CODE<0:A>.

The code generation unit 522 generates and outputs the codes CODE<0:A> according to whether the phase of the first period signal PER1 is earlier or later than the phase of the second period signal PER2. For this operation, the code generation unit 522 may include a phase comparison circuit 522A configured to compare the phases of the first period signal PER1 and the second period signal PER2 and generate an up/down signal UP/DN, and the code generation unit 522 may also include a counting circuit 522B configured to generate the codes CODE<0:A> in response to the up/down signal UP/DN.

The phase comparison circuit 522A compares the phases of the first period signal PER1 and the second period signal PER2, and the phase comparison circuit 522A outputs the down signal DN when the phase of the first period signal PER1 is earlier than the phase of the second period signal PER2 (more specifically, the period of the first period signal PER1 is shorter than the period of the second period signal PER2) and outputs the up signal UP when the phase of the first period signal PER1 is later than the phase of the second period signal PER2 (more specifically, the period of the first period signal PER1 is longer than the period of the second period signal PER2).

The counting circuit 522B outputs the initial value of the codes CODE<0:A> when it is initialized. Thereafter, if the up signal UP is outputted by the phase comparison circuit 422A, the counting circuit 522B increases the value of the codes CODE<0:A>, and if the down signal DN is outputted, the counting circuit 522B decreases the value of the codes CODE<0:A>. If the value of the codes CODE<0:A> increases, the delay value of the delay unit 523 increases, and if the value of the codes CODE<0:A> decreases, the delay value of the delay unit 523 decreases.

A plurality of delay circuits A_1 to A_M and B_1 to B_N and a procedure that generates a strobe signal STB and transmits an output signal OUT to the first chip 510 at the time that is determined according to the codes CODE<0:A> are the same as described above with reference to FIG. 3.

Similar to the integrated circuit system shown in FIG. 4, since the phases of the first period signal PER1 and the second period signal PER2 are compared and the codes CODE<0:A> are generated in correspondence to the difference between the phases of the first period signal PER1 and the second period signal PER2, the reference clock REF-CLK is not generated as in the integrated circuit systems shown in FIGS. 1 and 3.

Further, the first chip 510 and the second chip 520 may be configured in the same manner. For example, when the first chip 510 and the second chip 520 are stacked, the first chip 510 and the second chip 520 are chips for performing specified functions and, for example, only component elements necessary to perform the specified functions are activated among the component elements of the first and second chips 510 and 520. In detail, each of the first chip 510 and the second chip 520 may include the first period signal generation unit 511, the second period signal generation unit 521, the code generation unit 522, and the output control unit 523. In an example where the first chip 510 is a chip that transmits a signal CMD_OUT applied from the circuit outside of the integrated circuit system to the second chip 520 and transmits the output signal OUT of the second chip 520 to the circuit outside of the integrated circuit system, the first period signal generation unit 511 may be activated among the component elements of the first chip 510. In an example where the second chip 520 is a chip that transmits an output signal to the first chip 510, the second period signal generation unit 521, the code generation unit 522, and the output control unit 523 may be activated among the component elements of the second chip 520 such that the second chip 520 can transmit the output signal OUT to the first chip 510 at the time determined according to the codes CODE<0:A>.

Hereafter, operations of a memory system in accordance with another embodiment of the present invention will be described with reference again to FIG. 5. The memory system, which will be described with reference to FIG. 5, is substantially the same as the memory system described above with reference to FIG. 3, except for a method that controls the delay value of a strobe signal STB. Thus, an example where the integrated circuit system is a semiconductor memory system will be described below mainly with respect to this method.

In the example where the integrated circuit system is a semiconductor memory system, the first chip 510 corresponds to a master chip, and the second chip 520 corresponds to a slave chip. The internal configuration and operation of the master chip are the same as those of the first chip 510, and the internal configuration and operation of the slave chip are the same as those of the second chip 520. A signal applied from the circuit outside of the integrated circuit system to the first chip 510 may include a command, an address, data, and the like, and an output signal OUT of the second chip 520 may include data, etc.

The master chip 510 includes a first period signal generation unit 511 configured to generate a first period signal PER1. The master chip 510 transmits a signal (a command, an address, data, and the like) applied from a circuit outside of the memory system to the slave chip 520 and the master chip 510 transmits the data signal (corresponding to the output signal OUT of the integrated circuit system) transmitted from the slave chip 520 to the circuit outside of the memory system.

The slave chip 520 includes a second period signal generation unit 521 configured to generate a second period signal PER2, a code generation unit 522 configured to compare the phases of the first period signal PER1, and the second period signal PER2 and generate codes CODE<0: A>, and a data output control unit 523 configured to transmit the output data signal OUT of the slave chip 520 to the master chip 510 at a time that is determined according to the codes CODE<0:A>.

The code generation unit 522 generates and outputs the codes CODE<0:A> according to whether the phase of the first period signal PER1 is earlier or later than the phase of the second period signal PER2. For this operation, the code generation unit 522 may include a phase comparison circuit 522A configured to compare the phases of the first period signal PER1 and the second period signal PER2 and generate an up/down signal UP/DN, and the code generation unit 522 may also include a counting circuit 522B configured to generate the codes CODE<0:A> in response to the up/down signal UP/DN.

The phase comparison circuit 522A compares the phases of the first period signal PER1 and the second period signal PER2, and the phase comparison circuit 522A outputs the down signal DN when the phase of the first period signal PER1 is earlier than the phase of the second period signal PER2 (more specifically, the period of the first period signal PER1 is shorter than the period of the second period signal PER2) and outputs the up signal UP when the phase of the first period signal PER1 is later than the phase of the second period signal PER2 (more specifically, the period of the first period signal PER1 is longer than the period of the second period signal PER2).

The counting circuit 522B outputs the initial value of the codes CODE<0:A> when it is initialized. Thereafter, if the up signal UP is outputted by the phase comparison circuit 522A, the counting circuit 522B increases the value of the codes CODE<0:A>, and if the down signal DN is outputted, the counting circuit 522B decreases the value of the codes CODE<0:A>. If the value of the codes CODE<0:A> increases, the delay value of the delay unit 523 increases, and if the value of the codes CODE<0:A> decreases, the delay value of the delay unit 523 decreases.

A plurality of delay circuits A_1 to A_M and B_1 to B_N, and a procedure that generates a strobe signal STB and transmits the data signal OUT to the master chip 510 at the time that is determined according to the codes CODE<0:A> are the same as those of the memory system described above with reference to FIG. 3.

Since the phases of the first period signal PER1 and the second period signal PER2 are compared, and the codes CODE<0:A> are generated in correspondence to the difference between the phases of the first period signal PER1 and the second period signal PER2, the reference clock REFCLK may not be generated as in the memory system shown in FIG. 5.

As is apparent from the above descriptions, since operation timing variations among a plurality of chips are reduced, an operation margin may be secured, and a stable operation can be ensured, and an operation speed can be improved.

While the present invention has been described with respect to the specific embodiments, it will be apparent to those skilled in the art that various changes and modifications may be made without departing from the spirit and scope of the invention as defined in the following claims.

What is claimed is:
1. An integrated circuit system comprising:
a first chip including a first period signal generation unit configured to generate a first period signal, the first chip configured to transmit a first signal applied from a circuit outside of the integrated circuit system to a second chip and transmit a second signal transmitted from the second chip to the circuit outside of the integrated circuit system, wherein the first period signal has a period corresponding to an operation speed of the first chip that changes depending upon process, voltage and temperatures (PVT) conditions of the first chip: and the second chip including a second period signal generation unit configured to generate a second period signal, a code generation unit configured to generate a code corresponding to a difference between the period of the first period signal and a period of the second period signal, and an output control unit configured to transmit the second signal to the first chip at a time that is determined according to the code, wherein the second period signal has the period corresponding to an operation speed of the second chip that changes depending upon the PVT conditions of the second chip, wherein the code is generated based on a difference between a value obtained by counting a reference clock during an interval corresponding to the first period signal and a value obtained by counting the reference clock during an interval corresponding to the second period signal, wherein the first chip and the second chip are stacked, and the PVT conditions of the first chip are different from the PVT conditions of the second chip, wherein the output control unit comprises a strobe section configured to transmit the second signal to the first chip at a time when a strobe signal is activated and a delay line configured to control a delay value of the strobe signal according to the code, wherein the delay line comprises a plurality of asynchronous delay sections that are activated or deactivated in response to the code, and wherein the plurality of asynchronous delay sections delay a signal without being synchronized with a clock.

2. The integrated circuit system of claim 1, wherein when the operation speeds of the first chip and the second chip become slow, the first period of the first period signal and the period of the second period signal are lengthened, respectively, and when the operation speeds of the first chip and the second chip become fast, the period of the first period signal and the period of the second period signal are shortened, respectively.

3. A memory system comprising:

a master chip including a first period signal generation unit configured to generate a first period signal, the master chip configured to transmit a command, an address, and data applied from a circuit outside of the memory system to a slave chip and transmit output data transmitted from the slave chip to the circuit outside of the memory system, wherein the first period signal has a period corresponding to an operation speed of the master chip that changes depending upon process, voltage and temperatures (PVT) conditions of the master chip: and the slave chip comprising a second period signal generation unit configured to generate a second period signal, a code generation unit configured to generate a code corresponding to a difference between the period of the first period signal and a period of the second period signal of the slave chip, and a data output control unit configured to transmit the output data to the master chip at a time that is determined according to the code, wherein the second period signal has the period corresponding to an operation speed of the slave chip that changes depending upon the PVT conditions of the slave chip, wherein the code is generated based on a difference between a value obtained by counting a reference clock during an interval corresponding to the first period signal and a value obtained by counting the reference clock during an interval corresponding to the second period signal, wherein the first chip and the second chip are stacked, and the PVT conditions of the master chip are different from the PVT conditions of the slave chip, wherein the data output control unit comprises a strobe section configured to transmit the output data to the master chip at a time when a strobe signal is activated and a delay line configured to control a delay value of the strobe signal according to the code, wherein the delay line comprises a plurality of asynchronous delay sections that are activated or deactivated in response to the code, and wherein the plurality of asynchronous delay sections delay output data without being synchronized with a clock.

4. The memory system of claim 3, wherein when the operation speeds of the master chip and the slave chip become slow, the period of the first period signal and the period of the second period signal are lengthened, respectively, and when the operation speeds of the master chip and the slave chip become fast, the period of the first period signal and the period of the second period signal are shortened, respectively.

5. The memory system of claim 3, wherein transmission of the command, the address, the data, and the output data between file master chip and the slave chip is implemented through through-silicon vias that are formed through the master chip and the slave chip.

6. An integrated circuit system comprising:

a first chip including a first period signal generation unit configured to generate a first period signal, a second period signal generation unit configured to generate a second period signal, a code generation unit configured to generate a code, and an output control unit configured to transmit a signal at a time that is determined according to the code, wherein the output control unit comprises a strobe section configured to transmit the signal at a time when a strobe signal is activated and a delay line configured to control a delay value of the strobe signal according to the code, wherein the delay line comprises a plurality of asynchronous delay sections that are activated or deactivated in response to the code, and wherein the plurality of asynchronous delay sections delay a signal without being synchronized with a clock; and a second chip having the same structure as the first chip, wherein the first chip activates its first period signal generation unit to generate the first period signal of the first chip, transmits a first signal applied from a circuit outside of the integrated circuit system to the second chip, and transmits a second signal transmitted from the second chip to the circuit outside of the integrated circuit system, and wherein the second chip activates its second period signal generation unit to generate the second period signal of the second chip, its code generation unit to generate a code corresponding to a difference between a period of the first period signal from the first period signal generation unit of first chip and a period of the second period signal of the second chip, and its output control unit to transmit the second signal from the second chip to the first chip at the time that is determined according to the code, wherein the period of the first period signal of the first chip corresponds to an operation speed of the first chip that changes depending upon process, voltage and temperatures (PVT) conditions of the first chip, and the period of the second period signal of the second chip corresponds to an operation speed of the second chip that changes depending upon the PVT conditions of the second chip, wherein the code is generated based on a difference between a value obtained by counting a reference clock during an interval corresponding to the first period signal of the first chip and a value obtained by counting the reference clock during an interval corresponding to the second period signal of the second chip, and wherein the first chip and the second chip are stacked, and the PVT conditions of the first chip are different from the PVT conditions of the second chip.

7. An integrated circuit system comprising:

a first chip including a first period signal generation unit configured to generate a first period signal, wherein the first period signal has a period corresponding to an operation speed of the first chip that changes depending upon process, voltage and temperatures (PVT) conditions of the first chip: and a second chip including a second period signal generation unit configured to generate a second period signal, a code generation unit configured to generate a code corresponding to a difference between the period of the first period signal and a period of the second period signal, and an output control unit configured to transmit a signal to the first chip at a time that is determined according to the code, wherein the second period signal has the period corresponding to an operation speed of the second chip that changes depending upon the PVT conditions of the second chip, wherein the first chip and the second chip are stacked, and the PVT conditions of the first chip are different from the PVT conditions of the second chip, wherein the output control unit comprises a strobe section configured to transmit the signal to the first chip at a time when a strobe signal is activated and a delay line configured to control a delay value of the strobe signal according to the code, wherein the delay line comprises a plurality of asynchronous delay sections that are activated or deactivated in response to the code, and wherein the plurality of asynchronous delay sections delay a signal without being synchronized with a clock.

* * * * *

UNITED STATES PATENT AND TRADEMARK OFFICE
CERTIFICATE OF CORRECTION

PATENT NO. : 9,508,394 B2
APPLICATION NO. : 13/333863
DATED : November 29, 2016
INVENTOR(S) : Sang-Jin Byeon Page 1 of 1

It is certified that error appears in the above-identified patent and that said Letters Patent is hereby corrected as shown below:

On the Title Page

Please add the Foreign Application Priority Data section as follows:
(30)   Nov. 2, 2011   (KR) ................... 10-2011-0113622

Signed and Sealed this
Eighth Day of May, 2018

Andrei Iancu
*Director of the United States Patent and Trademark Office*